(12) United States Patent
Nam et al.

(10) Patent No.: US 7,135,411 B2
(45) Date of Patent: Nov. 14, 2006

(54) METHOD FOR ETCHING MESA ISOLATION IN ANTIMONY-BASED COMPOUND SEMICONDUCTOR STRUCTURES

(75) Inventors: Peter S. Nam, Cerritos, CA (US); Michael D. Lange, Anaheim, CA (US); Roger S. Tsai, Torrance, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 21 days.

(21) Appl. No.: 10/918,119

(22) Filed: Aug. 12, 2004

(65) Prior Publication Data

US 2006/0035467 A1    Feb. 16, 2006

(51) Int. Cl.
*H01L 21/306* (2006.01)
(52) U.S. Cl. .................. 438/714; 438/39; 438/41; 438/167; 438/354; 438/718
(58) Field of Classification Search .................. 438/39, 438/41, 167, 354, 714, 718; 439/718
See application file for complete search history.

(56) References Cited

U.S. PATENT DOCUMENTS

| | | |
|---|---|---|
| 4,640,737 A | 2/1987 | Nagasaka |
| 5,335,241 A * | 8/1994 | Okumura et al. ........ 372/46.01 |
| 6,133,593 A | 10/2000 | Boos |
| 6,384,432 B1 | 5/2002 | Berenz |
| 6,703,639 B1 * | 3/2004 | Yang et al. .................... 257/14 |

FOREIGN PATENT DOCUMENTS

WO    WO 2006/020355 A3 *    2/2006

OTHER PUBLICATIONS

A definition of the term "capping layer" from the USPTO manual of classification.*
Kanji Yoh et al.; An InAs Channel Heterojunction Field-Effect Transistor with High Transconductance; IEEE Electron Device Letters; Nov. 1, 1990; pp. 526-528; vol. 11, No. 11, IEEE Service Center; New York, NY, US.

* cited by examiner

*Primary Examiner*—George A. Goudreau
(74) *Attorney, Agent, or Firm*—Carmen B. Patti & Assoc., LLC

(57) ABSTRACT

Antimony-based semiconductor devices are formed over a substrate structure (10) that includes an antimony-based buffer layer (24) and an antimony-based buffer cap (26). Multiple epitaxial layers (30-42) formed over the substrate structure (10) are dry etched to form device mesas (12) and the buffer cap (26) provides a desirably smooth mesa floor and electrical isolation around the mesas.

20 Claims, 2 Drawing Sheets

METHOD FOR ETCHING MESA ISOLATION IN ANTIMONY-BASED COMPOUND SEMICONDUCTOR STRUCTURES

GOVERNMENT RIGHTS

This invention was made with Government support under contract number N00014-01-2-0014-0001. The Government has certain rights in this invention.

BACKGROUND OF THE INVENTION

This invention relates generally to semiconductor integrated circuit fabrication techniques and, more particularly, to techniques for ensuring adequate electrical isolation of multiple semiconductor devices formed on a common substrate. Device isolation is important in any integrated circuit (IC) and is critical to the design of integrated circuits that operate at higher frequencies, such as microwave monolithic integrated circuits (MMICs). In MMICs, a typical transistor device is the high electron mobility transistor (HEMT), which behaves much like a conventional field effect transistor (FET), but incorporates a conducting channel created by a heterostructure that confines charge carriers to a thin layer. The concentration of the carriers and their speed in this layer enables the transistor to maintain a high gain at very high frequencies. The heterostructure in a HEMT typically comprises multiple semiconductor layers formed epitaxially and appropriately etched to form a mesa projecting above the substrate. Device connections are made through contacts at the top of the mesa and device isolation is attained by ensuring that there is sufficient geometric clearance between adjacent devices.

The mesas of HEMTs or similar semiconductor structures are formed on a substrate that, for purposes of electrical isolation, must include areas of a relatively non-conducting material. This requirement is relatively easy to meet if the semiconductor structures are based on materials that are inherently semi-insulating, such as structures based on gallium arsenide (GaAs). There are, however, significant advantages, in terms of improved electrical properties, in using semiconductor heterostructures that include antimony-based layers as electron barriers. Unfortunately, there is no compatible semi-insulating substrate material for antimony-based semiconductors, and growing any antimony-based layer on a semi-insulating substrate of another material, such as GaAs, results in lattice defects, referred to as threading dislocations, in the antimony-based layer because the lattice parameter of the layer does not match that of the substrate. One way to mitigate the effect of the threading dislocations is to include a relatively thick metamorphic buffer layer of an antimony-based material, such as aluminum antimonide (AlSb). This effectively "buries" the dislocations, which become less pronounced towards the top of the buffer layer. Although the desired antimony-based layers may be formed epitaxially on the antimony-based (AlSb) buffer, this approach suffers from a significant disadvantage in that the AlSb material is not stable in air. Components or electrodes formed over an AlSb buffer inevitably suffer serious damage as the AlSb buffer disintegrates with exposure to air.

Accordingly, there is still a need for a technique for achieving mesa isolation in antimony-based semiconductor structures. The present invention satisfies this need.

SUMMARY OF THE INVENTION

The present invention resides in a method for etching mesa isolation in antimony-based compound semiconductor structures. Briefly, and in general terms, the method comprises the steps of forming an antimony-based buffer layer; forming an antimony-based buffer cap over the buffer layer; forming a plurality of epitaxial layers over the buffer cap, the plurality of epitaxial layers including at least one antimony-based layer; and removing defined portions of the plurality of epitaxial layers by dry etching to define at least one mesa structure. The antimony-based buffer cap provides electrical isolation around the mesa and a desirably smooth mesa floor area.

In an illustrative embodiment of the invention, the antimony-based buffer layer is formed over a substrate. The substrate may be of semi-insulating material, such as gallium arsenide (GaAs), the antimony-based buffer layer is of aluminum antimonide (AlSb) and the antimony-based buffer cap is aluminum gallium antimonide (e.g., $Al_{0.7}Ga_{0.3}Sb$).

More specifically, the step of removing defined portions of the plurality of epitaxial layers comprises protecting a desired mesa region of the plurality of epitaxial layers with a patterned protective layer; and dry etching unprotected regions around the desired mesa using an inductively coupled plasma system. Preferably, the dry etching step uses an etching medium comprising a mixture of chlorine ($Cl_2$) and boron trichloride ($BCl_3$).

It will be appreciated from the foregoing summary, that the invention provides a significant advance in the field of fabrication of high-frequency semiconductor integrated circuits, such as microwave monolithic integrated circuits (MMICs). In particular, the invention provides a method for providing device insulation in circuit structures of this type that use antimony-based semiconductor materials. Other aspects and advantages of the invention will become apparent from the following more detailed description, taken in conjunction with the accompanying drawings.

DETAILED DESCRIPTION OF THE INVENTION

Figure 1:
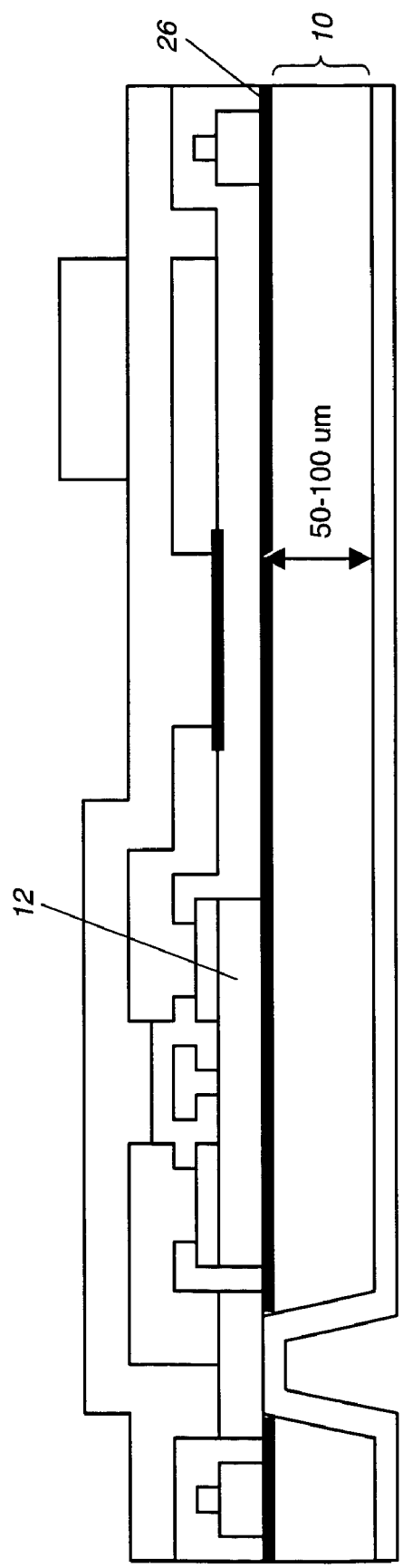
FIG. 1 is a fragmentary cross-sectional view (not to scale) of a microwave monolithic integrated circuit (MMIC) including at least one high electron mobility transistor (HEMT).

As shown in the drawings for purposes of illustration, the present invention pertains to semiconductor integrated circuit fabrication techniques, and particularly to methods for the fabrication of microwave monolithic integrated circuits (MMICs). As discussed above in the background section, there is a need for improvement in the techniques used to fabricate such circuits that use antimony-based semiconductor materials, and to provide electrical isolation for multiple devices formed of antimony-based materials.

In accordance with the present invention, isolation is provided by a substrate structure that includes an antimony-based metamorphic buffer capped by an antimony-based buffer cap layer that is stable in air. An important step in the method of the invention is dry etching down to the buffer cap layer to form electrically isolated devices on the substrate structure.

As depicted in FIG. 1, a typical semiconductor integrated circuit structure operable at high frequencies includes a substrate structure 10, and a number of heterostructures, such as the HEMT mesa structure 12, formed on the substrate structure. Additional layers of insulation and conductive metal are formed to provide appropriate interconnection and isolation of the devices in the integrated circuit structure. The lower or backside of the substrate structure 10 may include a metal plating layer 14, which forms a ground plane. The substrate structure 10 may also include backside vias, one of which is shown at 16, extending through the structure 10 to make contact with metal layers above the devices.

Figure 2:
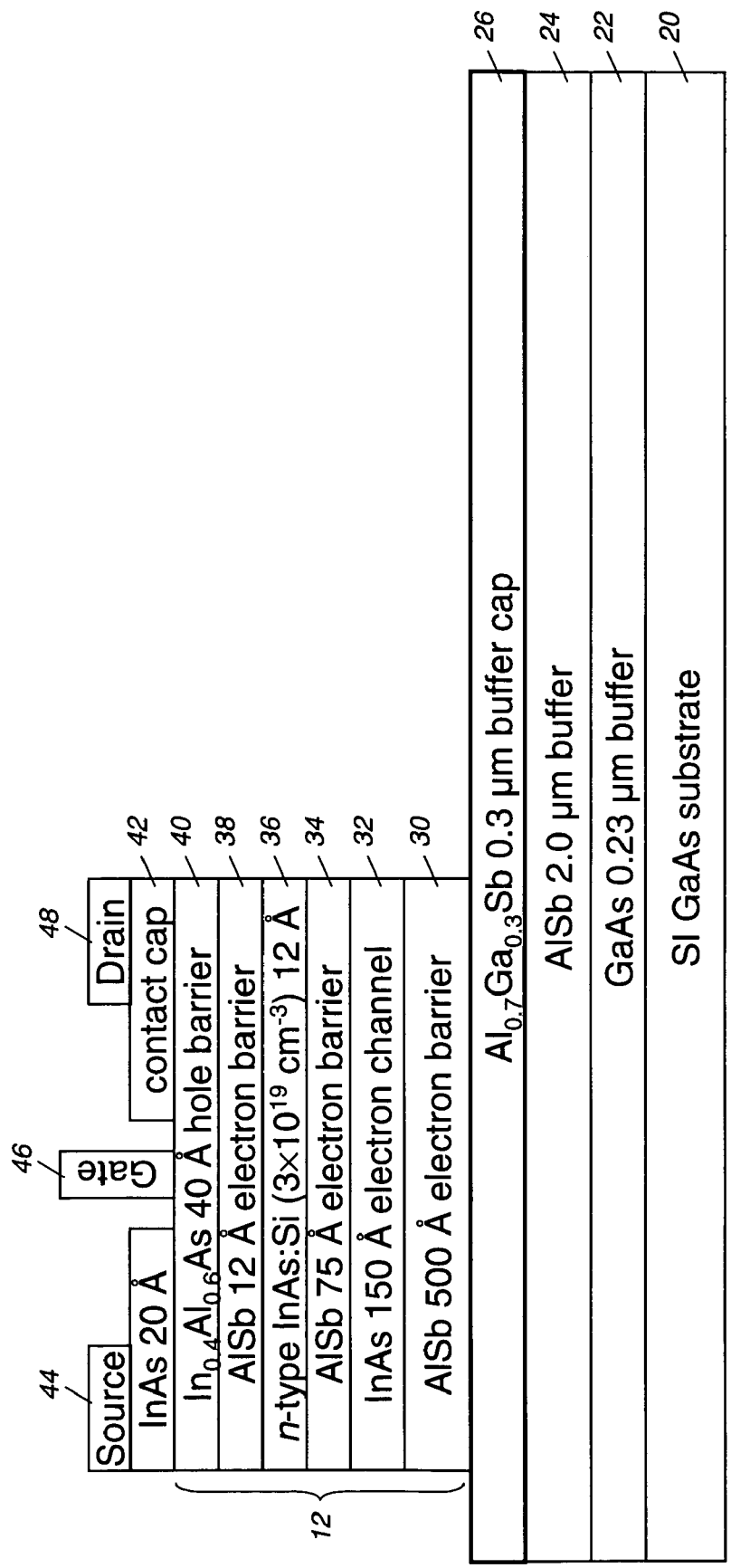
FIG. 2 is an enlarged (not to scale) fragmentary cross-section view depicting in more detail a portion of the circuit of FIG. 1.

An important aspect of the illustrative structure is the electrical isolation provided by regions of the substrate structure 10 that surround the HEMT mesa structure 12 and other similar mesas formed on the same substrate structure. When the HEMT mesa structure 12 includes antimony-based electron barrier layers, these materials are generally incompatible with a gallium arsenide (GaAs) semi-insulating substrate, and there is no available semi-insulating substrate for antimony-based semiconductors. In the illustrative embodiment of the invention, and as best shown in FIG. 2, the substrate structure 10 includes a relatively thick semi-insulating gallium arsenide (GaAs) substrate 20, on which is formed a thin GaAs buffer 22, shown by way of example as having a thickness of 0.23 µm, and a much thicker buffer 24 of aluminum antimonide (AlSb), shown by way of example as having a thickness of 2.0 µm. The buffer 24 functions as a transition layer between the gallium-arsenide-based semi-insulating substrate 20 and the antimony-based layers that will be formed over the substrate structure 10. The buffer 24 effectively "buries" threading dislocations that result from mismatched lattice parameters of the GaAs semi-insulating substrate 20 and the antimony-based buffer 22. The invention is not, of course, limited to a structure using GaAs as the substrate 20. Any other suitable material may be used, such as indium phosphide (InP), gallium antimonide (GaSb), indium arsenide (InAs), zinc telluride (ZnTe), and cadmium selenide (CdSe). The principles of the invention also apply to the fabrication of a structure over a temporary substrate, from which the structure is removed at the end of processing.

A critical aspect of the invention is the addition of an antimony-based buffer cap layer 26 over the AlSb buffer 24. This relatively thin (e.g., 0.3 µm) cap layer 26 may have any of a variety of antimony-based compositions, such as aluminum gallium antimonide. For example, the formulation $Al_{0.7}Ga_{0.3}Sb$ is shown in the illustrative embodiment, but the Al/Ga ratio is not necessarily limited to 70/30. The buffer cap layer 26 functions to provide the necessary electrical insulation for the HEMT mesa 12 and has the important property of being stable in air.

In the formation of the HEMT mesa 12 and similar devices on the substrate structure 10, a number of additional thin layers are grown epitaxially over the buffer cap layer 26. In the illustrative example, these additional device layers include an aluminum antimonide (AlSb) electron barrier layer 30 of 500 Å thickness, an indium arsenide (InAs) electron channel layer 32 of 150 Å thickness, another aluminum antimonide (AlSb) electron barrier layer 34 of 75 Å thickness, an n-type layer 36 of indium arsenide and silicon (InAs:Si) of 12 Å thickness, another aluminum antimonide (AlSb) electron barrier layer 38 of 12 Å thickness, an indium aluminum arsenide ($In_{0.4}Al_{0.6}As$) hole barrier layer 40 of 40 Å thickness, and an indium arsenide contact cap layer 42 of 20 Å thickness. None of these materials and thicknesses is intended to limit the present invention. The layer material specifications are provided only by way of example of a HEMT device incorporating antimony-based layers as electron barriers.

After formation of the device(s) by epitaxially growing the layers 30–42 on the substrate structure 10, the area of each device, such as the area of the mesa 12, is defined by conventional lithographic patterning techniques. That is to say, an etch-resistant layer (not shown) is applied over the entire structure and then patterned in such a way as to protect the mesa 12 area and similar other mesa areas from subsequent etching. An important aspect of the present invention is that regions of the layers 30–42 around the mesa 12 are etched using a dry etching process utilizing an inductively coupled plasma (ICP) system. This is a one-step etching process for all the epitaxial layers 30–42. The ICP system uses an etching medium incorporating an appropriate mixture of chlorine ($Cl_2$) in boron trichloride ($BCl_3$) and argon (Ar). The ICP system is controlled to operate at relatively low ICP power, low bias power and low pressure, resulting in a reliably slow and repeatable etch rate (approximately 150–300 Å/min.) needed to etch the relatively thin epitaxial layers 30–42 to define a shallow mesa 12. An important advantage of the ICP dry etching process is that it leaves a very smooth mesa floor, which is highly desirable for integration of various thin-film components, such as resistors. The dry etching process is continued through the epitaxial layers 30–42 and part-way into the buffer cap layer 26, to ensure that all of the layers 30–42 have been removed around the mesa 12 and that a desired degree of electrical isolation is obtained. Subsequent processing employs conventional steps to add source, gate and drain contacts 44, 46 and 48.

It will be appreciated from the foregoing that the present invention represents a significant advance in the field of fabrication of integrated circuitry for operation at very high frequencies. In particular, the invention provides an improved technique for fabricating microwave monolithic integrated circuits (MMICs) that incorporate antimony-based layers. It will also be appreciated that, although a specific embodiment of the invention has been illustrated and described by way of example, various modifications may be made without departing from the spirit and scope of the invention. Accordingly, the invention should not be limited except as by the appended claims.

The invention claimed is:

1. A method for etching mesa isolation in antimony-based compound semiconductor structures, the method comprising the steps of:
    forming an antimony-based buffer layer;
    forming an antimony-based buffer cap over the buffer layer;
    forming a plurality of epitaxial layers over the buffer cap, the plurality of epitaxial layers including at least one antimony-based layer; and
    removing defined portions of the plurality of epitaxial layers by dry etching to define at least one mesa structure;
    wherein the antimony-based buffer cap provides electrical isolation around the mesa and a smooth mesa floor area.

2. A method as defined in claim 1, wherein the first recited forming step forms the antimony-based buffer layer on a substrate.

3. A method as defined in claim 2, wherein the substrate is a semiconductor substrate.

4. A method as defined in claim 2, wherein the substrate is of a material selected from the group consisting of gallium arsenide (GaAs), indium phosphide (InP), gallium antimonide (GaSb), indium arsenide (InAs), zinc telluride (ZnTe), and cadmium selenide (CdSe).

5. A method as defined in claim 1, wherein the antimony-based buffer layer contains aluminum (Al) and antimony (Sb).

6. A method as defined in claim 5, wherein the antimony-based buffer layer is aluminum antimonide (AlSb).

7. A method as defined in claim 1, wherein the antimony-based buffer cap is aluminum gallium antimonide.

8. A method as defined in claim 7 wherein the antimony-based buffer cap material is $Al_{0.7}Ga_{0.3}Sb$.

9. A method as defined in claim 1, wherein the step of removing defined portions of the plurality of epitaxial layers comprises:
   protecting a desired mesa region of the plurality of epitaxial layers with a patterned protective layer; and
   dry etching unprotected regions around the desired mesa using a plasma system.

10. A method as defined in claim 9, wherein the dry etching step uses an inductively coupled plasma etching system.

11. A method as defined in claim 9, wherein the dry etching step uses an etching medium comprising a mixture of chlorine ($Cl_2$) and boron trichloride ($BCl_3$).

12. A method for etching mesa isolation in antimony-based compound semiconductor structures, the method comprising the steps of:
   forming an antimony-based buffer layer;
   forming an antimony-based buffer cap over the buffer layer;
   forming at least one antimony-based epitaxial layer over the buffer cap; and
   removing defined portions of the epitaxial layer to define at least one mesa structure;
   wherein the antimony-based buffer cap provides electrical isolation around the mesa and a smooth mesa floor area.

13. A method as defined in claim 12, wherein the first recited forming step forms the antimony-based buffer layer on a semiconductor substrate.

14. A method as defined in claim 13, wherein the substrate is of a material selected from the group consisting of gallium arsenide (GaAs), indium phosphide (InP), gallium antimonide (GaSb), indium arsenide (InAs), zinc telluride (ZnTe), and cadmium selenide (CdSe).

15. A method as defined in claim 12, wherein the antimony-based buffer layer is of aluminum antimonide (AlSb).

16. A method as defined in claim 12, wherein the antimony-based buffer cap is aluminum gallium antimonide.

17. A method as defined in claim 16 wherein the antimony-based buffer cap material is $Al_{0.7}Ga_{0.3}Sb$.

18. A method as defined in claim 12, wherein the step of removing defined portions of the at least one epitaxial layer comprises:
   protecting a desired mesa region of the at least one epitaxial layer with a patterned protective layer; and
   dry etching unprotected regions around the desired mesa using a plasma system.

19. A method as defined in claim 18, wherein the dry etching step uses an inductively coupled plasma etching system.

20. A method as defined in claim 18, wherein the dry etching step uses an etching medium comprising a mixture of chlorine ($Cl_2$) and boron trichloride ($BCl_3$).

* * * * *